(12) United States Patent
Yoda et al.

(10) Patent No.: US 7,808,150 B2
(45) Date of Patent: Oct. 5, 2010

(54) ACTUATOR HAVING DEFLECTED FIXED COMB ELECTRODES AND MOVABLE COMB ELECTRODES

(75) Inventors: Mitsuhiro Yoda, Nagano (JP); Keiji Isamoto, Aichi (JP); Hiroshi Toshiyoshi, Kanagawa (JP)

(73) Assignees: Seiko Epson Corporation (JP); The University of Tokyo (JP); Santec Corporation (JP)

( * ) Notice: Subject to any disclaimer, the term of this patent is extended or adjusted under 35 U.S.C. 154(b) by 0 days.

(21) Appl. No.: 12/607,341

(22) Filed: Oct. 28, 2009

(65) Prior Publication Data
US 2010/0045137 A1  Feb. 25, 2010

Related U.S. Application Data

(62) Division of application No. 11/443,471, filed on May 30, 2006, now Pat. No. 7,719,163.

(30) Foreign Application Priority Data
May 31, 2005 (JP) .............................. 2005-160530

(51) Int. Cl.
*H02N 1/00* (2006.01)
*G02B 26/08* (2006.01)
(52) U.S. Cl. ...................... 310/309; 359/225.1; 359/291
(58) Field of Classification Search .................. 310/309
See application file for complete search history.

(56) References Cited

U.S. PATENT DOCUMENTS 5,959,760 A  9/1999  Yamada et al.

(Continued)

FOREIGN PATENT DOCUMENTS

JP  2004-013099  1/2004

(Continued)

OTHER PUBLICATIONS

Ki-Hun jeong and Luke P. Lee, "A novel fabrication method of a vertical comb drive using a single SOI wafer for optical MEMS applications", Transducers, Solid-State Sensors, Actuators and Microsystems, 12$^{th}$ International Conference on 2003, Jun. 12, 2003, vol. 2, pp. 1462-1465.

(Continued)

*Primary Examiner*—Karl I Tamai
(74) *Attorney, Agent, or Firm*—Harness, Dickey & Pierce, P.L.C.

(57) ABSTRACT

An actuator that can be driven at a reduced voltage and manufactured with ease, and a method for manufacturing the same are provided. The actuator includes second supporting portions 31 and 32 secured to a supporting substrate 4 through a spacer, fixed portions 33 and 34 secured to the supporting substrate 4 with no intervention of the spacer, fixed comb electrodes 331 and 341 integrally formed the fixed portions 33 and 34 and meshing with movable comb electrodes 211 and 212 in a spaced-apart relationship, and bridge portions 35 and 36 for connecting the fixed portions 33 and 34 to the second supporting portions 31 and 32. The fixed portions 33 and 34 are affixed to the supporting substrate 4 in a condition that they are deflected toward the supporting substrate 4 with respect to the second supporting portions 31 and 32 while bending the bridge portions 35 and 36, thereby initially deflecting the fixed comb electrodes 331 and 341 so as to be out of alignment with the movable comb electrodes 211 and 212 in a thickness direction of the supporting substrate 4.

1 Claim, 7 Drawing Sheets

U.S. PATENT DOCUMENTS

| | | | |
|---|---|---|---|
| 6,910,379 B2 * | 6/2005 | Eskridge et al. | 73/504.14 |
| 7,089,666 B2 * | 8/2006 | Kim et al. | 29/896.9 |
| 7,095,156 B2 | 8/2006 | Yoda | |
| 7,161,274 B2 | 1/2007 | Tsuboi et al. | |
| 7,161,275 B2 | 1/2007 | Yoda | |
| 7,550,895 B2 | 6/2009 | Tsuboi et al. | |
| 2003/0082917 A1 | 5/2003 | Hopkins et al. | |
| 2006/0279169 A1 | 12/2006 | Yoda et al. | |
| 2009/0218909 A1 | 9/2009 | Tsuboi et al. | |
| 2010/0045137 A1 * | 2/2010 | Yoda et al. | 310/300 |

FOREIGN PATENT DOCUMENTS

| | | |
|---|---|---|
| JP | 2004-219839 | 8/2004 |
| JP | 2005-088188 | 4/2005 |
| JP | 2005-137102 | 5/2005 |
| JP | 2005-143235 | 6/2005 |

OTHER PUBLICATIONS

Isamoto et al., "Self-Assembly Technique for MEMS Vertical Comb Electrostatic Actuator", ICICE Electronis Express, vol. 2, No. 9, 311-315, May 10, 2005.

Xie et al. "A CMOS-MEMS Mirror with Curled-Hinge Comb Drives", Journal of Microelectronmechanical Systems, vol. 12, No. 4, Aug. 2003.

Patterson et al., "A Scanning Micromirror With Angular Comb Drive Actuation", IEEE Feb. 2002.

Machine Translation of JP 2004-219839, Sasaki et al., "Three Dimensional Structure and Its Manufacturing Method, and Electronic Equipment", Aug. 5, 2004.

* cited by examiner

ACTUATOR HAVING DEFLECTED FIXED COMB ELECTRODES AND MOVABLE COMB ELECTRODES

CROSS-REFERENCE TO RELATED APPLICATION

This application is a divisional of U.S. patent application Ser. No. 11/443,471 filed on May 30, 2006. This application claims the benefit of Japanese Patent Application No. 2005-160530 filed May 31, 2005. The disclosures of the above applications are incorporated herein by reference.

TECHNICAL FIELD

The present invention relates to an actuator and a method for manufacturing the same.

BACKGROUND ART

There is known a polygon mirror (rotary polyhedron) as an actuator provided in laser printers, for example. In such a printer, in order to achieve higher-resolution and higher-quality printed output as well as higher-speed printing, it is necessary to rotate the polygon mirror at higher speed. Currently, an air bearing is used to rotate the polygon mirror at high speed with stability. However, the method using the air bearing involves a problem in that it is difficult to rotate the polygon mirror at much higher speed than the speed available at the present. Further, although a larger motor is required in order to rotate the polygon mirror at higher speed, use of such a larger motor gives rise to a problem in that it is difficult to miniaturize the size of an apparatus in which the polygon mirror is used. Furthermore, use of such a polygon mirror gives rise to another problem in that the structure of the apparatus becomes necessarily complicated, thus leading to an increased manufacturing cost.

Taking such problems into account, an actuator of a relatively simple structure has been proposed that employs a torsional vibrator (for example, see JP-A No. 2004-13099). The actuator disclosed in this reference includes a fixed comb electrode and a movable comb electrode, both of which mesh with each other in a spaced-apart relationship. In the actuator of this type, alternating voltages are applied to between the fixed comb electrode and the movable comb electrode, thus creating an electrostatic attractive force to rotate the movable electrode. In the actuator referred to above, a SOI substrate having a $SiO_2$ layer sandwiched between two silicon layers is used. The movable comb electrode is patterned on one of the silicon layers of the SOI substrate, while the fixed comb electrode is patterned on the other silicon layer of the SOI substrate. Thus, the fixed comb electrode and the movable comb electrode remain out of alignment with each other in a thickness direction of the SOI substrate. This enables the actuator to start its operation in an easier manner.

According to the above-described actuator, however, it is necessary to form masks on the opposite surfaces of the SOI substrate by use of a photoresist and then to etch both of the silicon layers, at the time of forming the fixed comb electrode and the movable comb electrode. For this reason, the gap between the fixed comb electrode and the movable comb electrode varies depending on the alignment accuracy of the masks formed on the opposite surfaces of the SOI substrate, thereby making it difficult to provide the gap with an increased degree of precision. As a result, the gap between the fixed comb electrode and the movable comb electrode becomes greater, which results in a problem in that an increased drive voltage is required.

DISCLOSURE OF THE INVENTION

In view of the above problems, it is an object of the present invention to provide an actuator that can be driven at a reduced drive voltage and can be manufactured with ease, and a method for manufacturing the same.

In order to achieve the above object, one aspect of the present invention is directed to an actuator comprising:

a supporting substrate;

a spacer provided on the supporting substrate;

first supporting portions each secured to the supporting substrate through the spacer;

a mass portion having a movable comb electrode and adapted to be rotatable with respect to the first supporting portions;

elastic connecting portions for interconnecting the mass portion to the first supporting portions, respectively, in such a manner that the mass portion can be rotated with respect to the first supporting portions;

at least one second supporting portion secured to the supporting substrate through the spacer;

at least one fixed portion affixed to the supporting substrate with no intervention of the spacer;

a fixed comb electrode integrally formed with or connected to the fixed portion and meshing with the movable comb electrode in a spaced-apart relationship; and a bridge portion for directly or indirectly connecting the fixed portion to the second supporting portion, wherein the fixed portion is affixed to the supporting substrate in a state that the fixed portion is deflected toward the supporting substrate with respect to the second supporting portion while bending the bridge portion, thereby initially deflecting the fixed comb electrode so as to be out of alignment with the movable comb electrode in a thickness direction of the supporting substrate, wherein the mass portion is rotated by applying alternating voltages across the movable comb electrode and the fixed comb electrode.

In this actuator, due to the fact that the fixed comb electrode is initially deflected so as to be out of alignment with the movable comb electrode in the thickness direction of the supporting substrate, it is possible for the actuator to start its operation smoothly. Further, due to the fact that the fixed comb electrode and the movable comb electrode can be concurrently patterned on one and the same layer with the use of the same mask in the process of manufacturing the actuator, it becomes possible not only to quite accurately form the gaps between the fixed comb electrode and the movable comb electrode, but also to simplify the process of manufacturing the actuator. This helps to reduce the size of the gaps, thus making the actuator operable at a lower drive voltage. Additionally, the initial deflection can be effected merely by affixing the fixed portion to the supporting substrate after the fixed comb electrode and the movable comb electrode have been subjected to the patterning process. This also helps to simplify the process for manufacturing the actuator.

In particular, according to this actuator, the above-described initial deflection is created by deflecting the fixed comb electrode, which means that the advantageous effects described above can be attained without increasing the size of the parts that constitute the vibrating system. Moreover, due to the fact that the above-described initial deflection is created by deflecting the fixed comb electrode, the shape and the size of the parts that constitute the vibrating system can be selected in compliance with the manufacturer's desire, thus allowing the actuator to exhibit the desired characteristics as well as to accomplish the advantageous effects described above.

In the actuator according to the present invention, it is preferred that the first supporting portions, the mass portion, the elastic connecting portions, the second supporting portion, the fixed portion, the fixed comb electrode and the bridge portion are formed by patterning one layer provided on the supporting substrate.

This makes it possible to manufacture the actuator in a simpler manner.

Further, in the actuator according to the present invention, it is preferred that the movable comb electrode is provided in one pair at opposite sides of the mass portion with respect to a rotational axis about which the mass portion rotates.

This ensures that the actuator starts its operation smoothly and continues to be driven in a trouble-free fashion.

Further, in the actuator according to the present invention, it is preferred that the mass portion is of a plate shape having a major surface and has a light reflecting portion provided on the major surface of the mass portion.

This allows the actuator of the present invention to find its application in optical devices such as an optical scanner, an optical attenuator, an optical switch and the like.

Furthermore, in the actuator according to the present invention, it is also preferred that the fixed comb electrode is provided at least in one pair in a corresponding relationship with the pair of movable comb electrodes of the mass portion, and at least one of the pair of fixed comb electrodes is initially deflected toward the supporting substrate with respect to the second supporting portion.

This ensures that the actuator starts its operation smoothly and that the actuator is driven in a trouble-free fashion.

In the actuator described above, it is preferred that one of the pair of fixed comb electrodes is initially deflected toward the supporting substrate with respect to the second supporting portion.

This also ensures that the actuator starts its operation more smoothly and that the actuator is driven in a trouble-free fashion.

Further, in the actuator described above, it is also preferred that the other of the pair of fixed comb electrodes is initially deflected away from the supporting substrate with respect to the second supporting portion.

This also ensures that the actuator starts its operation much more smoothly and that the actuator is driven in a still more trouble-free fashion.

Moreover, in the actuator according to the present invention, it is also preferred that the supporting substrate having a major surface, and the fixed comb electrode is initially deflected so as to be inclined with respect to the major surface of the supporting substrate due to a manner of the affixing.

This also ensures that the actuator starts its operation more smoothly and that the actuator is driven in a trouble-free fashion.

Moreover, in the actuator according to the present invention, it is also preferred that the fixed comb electrode is connected to the fixed portion through a linking member, and the bridge portion is adapted to couple the fixed comb electrode to the second supporting portion, wherein the initial deflection is effected by rotating the fixed comb electrode about a coupling point of the bridge portion to the fixed comb electrode.

This makes it possible to incline the fixed comb electrode with respect to the major surface of the supporting substrate in a relatively simple manner.

Moreover, in the actuator according to the present invention, it is also preferred that each fixed portion is of a plate shape and has a plurality of slits formed through a thickness direction thereof.

This makes it possible to easily affix the fixed portion to the supporting substrate at the time of manufacturing the actuator.

Another aspect of the present invention is directed to an actuator comprising:

a supporting substrate;

a spacer provided on the supporting substrate;

first supporting portions each secured to the supporting substrate through the spacer;

first mass portions rotatable with respect to the first supporting portions, each of the first mass portions having a movable electrode;

a second mass portion rotatable with respect to the first mass portions;

first elastic connecting portions for interconnecting the first supporting portions and the first mass portions, respectively, in such a manner that the first mass portions can be rotated with respect to the first supporting portions;

second elastic connecting portions for interconnecting the first mass portions and the second mass portion in such a manner that the second mass portion can be rotated with respect to the first mass portions;

at least one second supporting portion secured to the supporting substrate through the spacer;

fixed portions affixed to the supporting substrate with no intervention of the spacer;

fixed comb electrodes integrally formed with or connected to the fixed portions, respectively, and meshing with the respective movable comb electrodes in a spaced-apart relationship; and bridge portions for directly or indirectly connecting the fixed portions to the second supporting portion, wherein the fixed portions are affixed to the supporting substrate in a state that the fixed portions are deflected toward the supporting substrate with respect to the second supporting portion while bending the bridge portions, thereby initially deflecting the fixed comb electrodes so as to be out of alignment with the movable comb electrodes in a thickness direction of the supporting substrate, wherein the first mass portions are rotated by applying alternating voltages to between the movable comb electrodes and the fixed comb electrodes and the second mass portion is rotated in response to the rotation of the first mass portions.

In this actuator, due to the fact that the fixed comb electrodes are initially deflected so as to be out of alignment with the movable comb electrodes in the thickness direction of the supporting substrate, it is possible for the actuator to start its operation smoothly. Further, due to the fact that the fixed comb electrodes and the movable comb electrodes can be concurrently patterned on one and the same layer with the use of the same mask in the process of manufacturing the actuator, it becomes possible not only to quite accurately form the gaps between the fixed comb electrodes and the movable comb electrodes, but also to simplify the process of manufacturing the actuator. This helps to reduce the size of the gaps, thus making the actuator operable at a lower drive voltage. Additionally, the initial deflection can be effected merely by affixing the fixed portions to the supporting substrate after the fixed comb electrodes and the movable comb electrodes have been subjected to the patterning process. This also helps to simplify the process for manufacturing the actuator.

In addition, this actuator is able to increase the amplitude of vibration of the second mass portion while reducing that of the first mass portions. Namely, it is possible for the actuator to make greater the amplitude of vibration of the second mass portion while reducing the drive voltage.

In particular, according to this actuator, the above-described initial deflection is created by deflecting the fixed comb electrodes, which means that the advantageous effects noted above can be attained without increasing the size of the parts that constitute the vibrating system. Moreover, due to the fact that the above-described initial deflection is created by deflecting the fixed comb electrodes, the shape and the size of the parts that constitute the vibrating system can be selected in compliance with the manufacturer's desire, thus allowing the actuator to exhibit the desired characteristics as well as to accomplish the advantageous effects described above.

In the actuator according to the present invention, it is preferred that the first supporting portions, the first mass portions, the second mass portion, the first elastic connecting portions, the second elastic connecting portions, the second supporting portion, the fixed portions, the fixed comb electrodes and the bridge portions are formed by patterning one layer provided on the supporting substrate.

This makes it possible to manufacture the actuator in a simpler manner.

In the actuator according to the present invention, it is preferred that the movable comb electrode is provided in one pair at opposite sides of each of the first mass portions with respect to a rotational axis about which the first mass portion rotates.

This ensures that the actuator starts its operation smoothly and continues to be driven in a trouble-free fashion.

In the actuator according to the present invention, it is preferred that the second mass portion is of a plate shape having a major surface and has a light reflecting portion provided on the major surface of the second mass portion.

This allows the actuator of the present invention to find its application in optical devices such as an optical scanner, an optical attenuator, an optical switch and the like.

In the actuator according to the present invention, it is preferred that the fixed comb electrode is provided at least in one pair in a corresponding relationship with the movable comb electrodes of each of the first mass portions, and at least one of the pair of fixed comb electrodes is initially deflected toward the supporting substrate with respect to the second supporting portion.

This ensures that the actuator starts its operation smoothly and the actuator is driven in a trouble-free fashion.

In the actuator described above, it is preferred that one of the pair of fixed comb electrodes is initially deflected toward the supporting substrate with respect to the second supporting portion.

This also ensures that the actuator starts its operation more smoothly and that the actuator is driven in a trouble-free fashion.

Further, in the actuator described above, it is preferred that the other of the pair of fixed comb electrodes is initially deflected away from the supporting substrate with respect to the second supporting portion.

This also ensures that the actuator starts its operation much more smoothly and that the actuator is driven in a still more trouble-free fashion.

Furthermore, in the actuator according to the present invention, it is preferred that the fixed comb electrode is initially deflected so as to be inclined with respect to a major surface of the supporting substrate.

This also ensures that the actuator starts its operation more smoothly and that the actuator is driven in a trouble-free fashion.

Moreover, in the actuator according to the present invention, it is preferred that wherein each of the fixed comb electrodes is connected to the corresponding fixed portion through a linking member, and the bridge portion is adapted to couple the fixed comb electrode to the second supporting portion, wherein the initial deflection is effected by rotating the fixed comb electrode about a coupling point of the bridge portion to the fixed comb electrode.

This makes it possible to incline the fixed comb electrodes with respect to the major surface of the supporting substrate in a relatively simple manner.

Moreover, in the actuator according to the present invention, it is preferred that the fixed portion is of a plate shape and has a plurality of slits formed through a thickness direction thereof.

This makes it possible to easily affix the fixed portion to the supporting substrate at the time of manufacturing the actuator.

A further aspect of the present invention is directed to a method for manufacturing the actuator according to the "one aspect" described above. The method comprises:

a first step of preparing a substrate comprised of a first layer, a second layer and a third layer deposited one atop above in the named sequence;

a second step of patterning the first layer into a shape corresponding to the first supporting portions, the mass portion, the elastic connecting portions, the second supporting portion, the fixed portion, the fixed comb electrode and the bridge portion;

a third step of patterning the second layer into a shape corresponding to the spacer; and a fourth step of affixing the part of the first layer corresponding to the fixed portion to the third layer.

This makes it possible to easily manufacture the actuator of a single-degree-of-freedom vibrating system operable at a reduced voltage.

In this manufacturing method, it is preferred that the method further comprises a step of cleansing the substrate with cleansing fluid prior to the fourth step, wherein the part of the first layer corresponding to the fixed portion is brought into contact with and affixed to the third layer at the fourth step by drying and removing the cleansing fluid present between the part of the first layer corresponding to the fixed portion and the third layer.

This makes it possible to easily affix the fixed portion to the supporting substrate at the time of manufacturing the actuator.

A still further aspect of the present invention is directed to a method for manufacturing the actuator according to the "another aspect" described above. The method comprises:

a first step of preparing a substrate comprised of a first layer, a second layer and a third layer deposited one atop above in the named sequence;

a second step of patterning the first layer into a shape corresponding to the first supporting portions, the first mass portions, the second mass portion, the first elastic connecting portions, the second elastic connecting portions, the second supporting portion, the fixed portions, the fixed comb electrodes and the bridge portions;

a third step of patterning the second layer into a shape corresponding to the spacer; and a fourth step of affixing the part of the first layer corresponding to the fixed portion to the third layer.

This also makes it possible to easily manufacture the actuator of a two-degree-of-freedom vibrating system operable at a reduced voltage.

In this manufacturing method described above, it is preferred that the method further comprises a step of cleansing the substrate with cleansing fluid prior to the fourth step, wherein the part of the first layer corresponding to the fixed portions is brought into contact with and affixed to the third layer at the fourth step by drying and removing the cleansing fluid present between the part of the first layer corresponding to the fixed portions and the third layer.

This also makes it possible to easily affix the fixed portion to the supporting substrate at the time of manufacturing the actuator.

These and other objects, structures and results of the present invention will be apparent more clearly when the following detailed description of the preferred embodiments is considered taken in conjunction with the appended drawings.

BEST MODE FOR CARRYING OUT THE INVENTION

Hereinafter, preferred embodiments of an actuator according to the invention will be described with reference to the appended drawings.

First Embodiment

Figure 1:
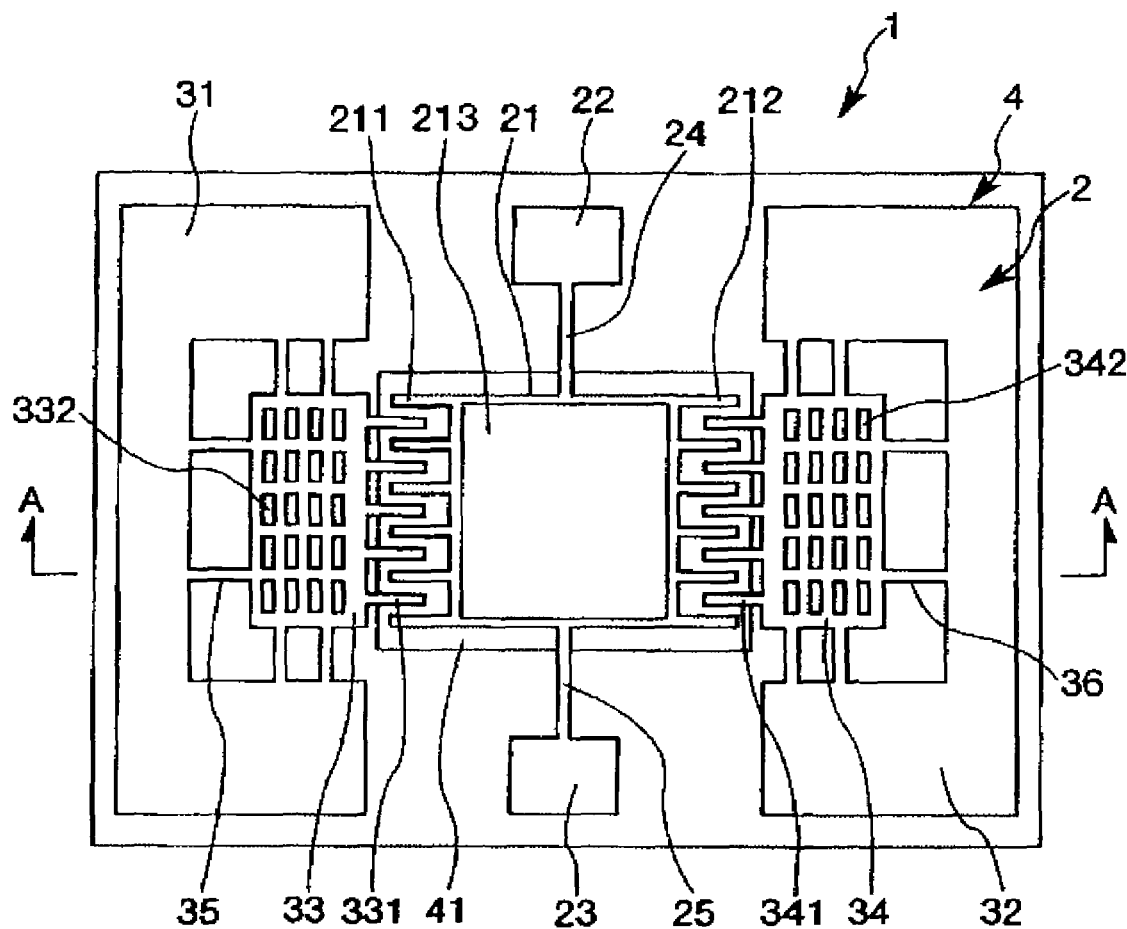
FIG. 1 is a plan view which shows a first embodiment of the actuator according to the present invention.
Figure 2A:
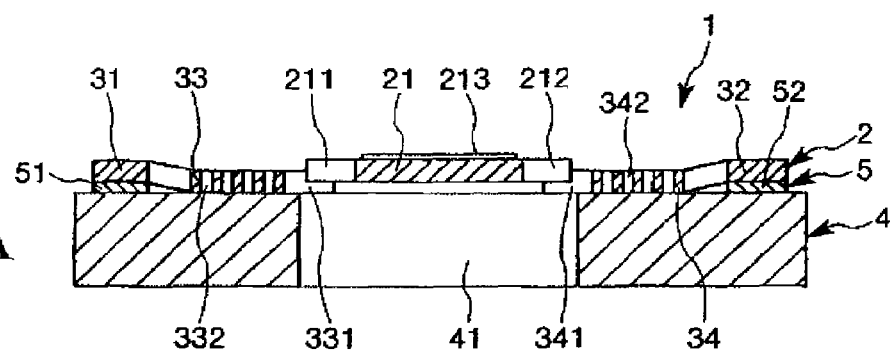
FIG. 2A and FIG. 2B are cross-sectional views of the actuator taken along line A-A in FIG. 1.
Figure 2B:
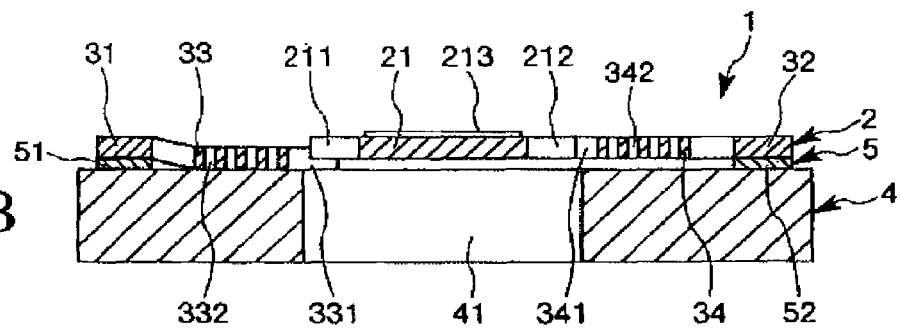

Initially, a first embodiment of the actuator according to the invention will be described. FIG. 1 is a plan view which shows a first embodiment of the actuator according to the invention. FIG. 2A and FIG. 2B are cross-sectional views of the actuator taken along line A-A in FIG. 1. FIG. 3A to FIG. 3E are views illustrating a method for manufacturing the actuator shown in FIG. 1. For the purpose of convenience in description, it should be noted that the front, the back, the right side and the left side, as viewed with respect to the paper plane in FIG. 1, will be respectively referred to as "upper", "lower", "right" and "left", or their equivalents, in the following description. Further, the right side, the left side, the top and the bottom, as viewed with respect to the paper plane in FIG. 2A and FIG. 2B, will be respectively referred to as "right", "left", "upper" and "lower", or their equivalents.

The actuator 1 shown in FIG. 1 includes a structural body 2 having a single-degree-of-freedom vibrating system. The structural body 2 is supported on a supporting substrate 4 through a spacer 5, as best shown in FIG. 2A and FIG. 2B. The structural body 2 is provided with a mass portion 21, first supporting portions 22 and 23, elastic connecting portions 24 and 25 for connecting the respective one of the first supporting portions 22 and 23 to the mass portion 21, second supporting portions 31 and 32, fixed portions 33 and 34, and bridge portions 35 and 36 for joining the respective one of the fixed portions 33 and 34 to the second supporting portions 31 and 32.

The structural body 2 is obtained by, for instance, conducting a patterning task with respect to one silicon layer, as set forth later. In other words, the first supporting portions 22 and 23, the mass portion 21, the elastic connecting portions 24 and 25, the second supporting portions 31 and 32, the fixed portions 33 and 34 (including fixed comb electrodes 331 and 341 described later), and the bridge portions 35 and 36 are formed by patterning one layer provided on the supporting substrate 4. This allows the actuator 1 to be manufactured in an easier manner, as set forth below.

The mass portion 21 is of a plate shape and has a movable comb electrode 211 of a pectinate shape at one end (a left side end) of the transversely opposite ends as viewed in FIGS. 1 and 2 and a movable comb electrode 212 of a pectinate shape at the other end (a right side end) of the transversely opposite ends.

Namely, the movable comb electrodes 211 and 212 are provided in pair at the opposite sides of the mass portion 21 with a rotational axis of the mass portion 21 lying therebetween. This ensures that the actuator 1 starts its operation smoothly and that the actuator is driven in a trouble-free fashion.

Further, the mass portion 21 is provided with a light reflecting portion 213 on its top surface. This allows the actuator 1 of the present invention to find its application in optical devices such as an optical scanner, an optical attenuator, an optical switch and the like.

The first supporting portions 22 and 23 for supporting the mass portion 21 are bonded to the supporting substrate 4 through a spacer 5 described later.

The elastic connecting portions 24 and 25 are provided in pair between the mass portion 21 and each of the first supporting portions 22 and 23 at the opposite ends of the mass portion 21. The elastic connecting portions 24 and 25 are arranged coaxially with each other, and the mass portion 21 is capable of rotating with respect to the first supporting portions 22 and 23 about the elastic connecting portions 24 and 25 that serve as a rotational center shaft (rotational axis).

Each of the elastic connecting portions 24 and 25 has a spring constant $k_1$ of preferably $1 \times 10^{-4}$ to $1 \times 10^4$ Nm/rad, more preferably $1 \times 10^{-2}$ to $1 \times 10^3$ Nm/rad and further more preferably $1 \times 10^{-1}$ to $1 \times 10^2$ Nm/rad. This makes it possible to increase the rotational angle (vibrating angle) of the mass portion 21, while reducing the drive voltage thereof. In this way, the mass portion 21, the first supporting portions 22 and 23, and the elastic connecting portions 24 and 25 cooperate to constitute a single-degree-of-freedom vibrating system.

In order to drive the single-degree-of-freedom vibrating system noted above, integrally formed with the fixed portions 33 and 34 are fixed comb electrodes 331 and 341 which in turn mesh with the movable comb electrodes 211 and 212 of the mass portion 22 in a spaced-apart relationship, respectively. Namely, the structural body 2 is provided with the fixed comb electrodes 331 and 341 that respectively correspond to the movable comb electrodes 211 and 212 of the mass portion 2.

Further, the fixed portions 33 and 34 are of a plate shape and directly affixed (attached) to the supporting substrate 4 with no intervention of the spacer 5. This ensures that, as shown in FIG. 2A, the fixed comb electrodes 331 and 341 are initially deflected so as to be out of alignment with the movable comb electrodes 211 and 212 in a thickness direction of the supporting substrate 4, that is, deflected toward the supporting substrate 4 by the same distance as the thickness of the spacer 5.

In the present embodiment, as illustrated in FIG. 2A, the fixed comb electrodes 331 and 341 are both initially deflected toward the supporting substrate 4 with respect to the second supporting portions 31 and 32. This ensures that the actuator 1 starts its operation smoothly and continues to be driven in a trouble-free fashion.

Further, as illustrated in FIG. 2B, only one of the fixed comb electrodes 331 and 341 may be initially deflected toward the supporting substrate 4 with respect to the second supporting portions 31 and 32. This also ensures that the actuator 1 starts its operation smoothly and continues to be driven in a more trouble-free fashion. In this case, a spacer may optionally intervene between the fixed portion 34 at the initially non-deflected side and the supporting substrate 4. In other words, the fixed portion 34 at the initially non-deflected side may constitute a part of the second supporting portion 32.

In addition, each of the fixed portions 33 and 34 has a plurality of slits 332 and 342 formed through the thickness direction thereof. This makes sure that, when the actuator 1 is manufactured in the below-described manner, the fixed portions 33 and 34 are affixed to the supporting substrate 4 with ease. It is to be noted that the slits of the fixed portions 33 and 34 are not restricted to the ones described above, but may have an arbitrary shape, position and number as far as they can provide the afore-mentioned advantageous effects.

The fixed portions 33 and 34 are joined to the second supporting portions 31 and 32 through the bridge portions 35 and 36. Namely, the bridge portions 35 and 36 serve to directly connect the fixed portions 33 and 34 to the second supporting portions 31 and 32.

Each of the bridge portions 35 and 36 is comprised of six rod-like members. Further, the bridge portions 35 and 36 are not restricted to the ones noted above but may have a constituent member of an arbitrary shape, position and number, for example, as far as the below-described initial position can be set.

The second supporting portions 31 and 32 are fixedly secured to the supporting substrate 4 through the spacer 5. Accordingly, the fixed portions 33 and 34 are affixed to the supporting substrate 4 in a condition that they are deflected toward the supporting substrate 4 with respect to the second supporting portions 31 and 32 while bending the bridge portions 35 and 36. This allows the fixed comb electrodes 331 and 341 to assume an initial position in such a manner that they are out of alignment with the movable comb electrodes 211 and 212 in the thickness direction of the supporting substrate 4, as set forth earlier.

The supporting substrate 4 is mainly composed of, e.g., a variety of glass, silicon or the like. As depicted in FIGS. 1 and 2, an opening 41 is formed through the supporting substrate 4 to permit rotation of the mass portion 21.

The opening 41 plays a role of an escape portion that prevents the mass portion 21 from making contact with the supporting substrate 4 when rotated or vibrated. By providing the opening (escape portion) 41, it becomes possible to increase the vibrating angle (amplitude) of the mass portion 21 while avoiding the overall size of the actuator 1 from being increased. The above-mentioned escape portion may be formed of a recess in place of the opening 41, provided that the recess allows rotation of the mass portion 21.

The spacer 5 is provided on the supporting substrate 4 and includes first spacer portions 51 and 52 for supporting the second supporting portions 31 and 32 and second spacer portions (not shown) for supporting the first supporting portions 22 and 23. In other words, the first supporting portions 22 and 23 are secured to the supporting substrate 4 through the second spacer portions (not shown) of the spacer 5, whereas the second supporting portions 31 and 32 are affixed to the supporting substrate 4 through the first spacer portions 51 and 52.

Next, description will be given to a method of operating the actuator 1 according to the present embodiment.

Voltages (e.g., alternating voltages having a phase difference of 180°) are alternately applied to between the movable comb electrode 211 and the fixed comb electrode 331 and between the movable comb electrode 212 and the fixed comb electrode 341. This creates an electrostatic force (Coulomb force) alternately between the movable comb electrode 211 and the fixed comb electrode 331 and between the movable comb electrode 212 and the fixed comb electrode 341. The electrostatic force enables the mass portion 21 to vibrate or rotate about a rotational center axis, i.e., about the elastic connecting portions 24 and 25, in such a manner that the mass portion 21 is inclined with respect to the major surface of the supporting substrate 4 (the surface parallel to the paper plane in FIG. 1).

In this way, the actuator 1 causes the mass portion 21 to rotate by applying the alternating voltages to between the movable comb electrodes 211 and 212 and the fixed comb electrodes 331 and 341.

In this actuator 1, due to the fact that the fixed comb electrodes 331 and 341 are initially deflected so as to be out of alignment with the movable comb electrodes 211 and 212 in the thickness direction of the supporting substrate 4, it is possible for the actuator 1 to start its operation smoothly. Further, due to the fact that the fixed comb electrodes 331 and 341 and the movable comb electrodes 211 and 212 can be concurrently patterned on one and the same layer with the use of the same mask in the below-described process of manufacturing the actuator 1, it becomes possible not only to quite accurately form the gaps between the fixed comb electrodes 331 and 341 and the movable comb electrodes 211 and 212, but also to simplify the process of manufacturing the actuator 1. This helps to reduce the size of the gaps, thus making the actuator 1 operable at a lower drive voltage. Additionally, the above-described initial deflection can be effected merely by affixing the fixed portions 33 and 34 to the supporting substrate 4 after the fixed comb electrodes 331 and 341 and the movable comb electrodes 211 and 212 have been subjected to the patterning process. This also helps to simplify the process for manufacturing the actuator 1.

In particular, according to the present invention, the above-described initial deflection is created by deflecting the fixed comb electrodes 331 and 341, which means that the advantageous effects described above can be attained without increasing the size of the parts that constitute the vibrating system. Moreover, due to the fact that the above-described initial deflection is created by deflecting the fixed comb electrodes 331 and 341, the shape and the size of the parts that constitute the vibrating system can be selected in compliance with the manufacturer's desire, thus allowing the actuator 1 to exhibit the desired characteristics as well as to accomplish the advantageous effects described above.

Next, one exemplary method for manufacturing the actuator 1 shown in FIGS. 1 and 2 will be described with reference to FIG. 3A to FIG. 3E, which are process views illustrating a method for manufacturing the actuator 1. Each of the views in FIG. 3A to FIG. 3E corresponds to the cross-section taken along line A-A in FIG. 1.

The method for manufacturing the actuator 1 comprises the steps of: [1] preparing a three-layer substrate having a first layer, a second layer and a third layer deposited one atop above in the named sequence, [2] etching the first layer, [3] etching the third layer, [4] etching the second layer, and [5] affixing a part of the first layer to the third layer. The respective steps will now be described one after another.

[1] Substrate Preparing Step (First Step)

Figure 3A:
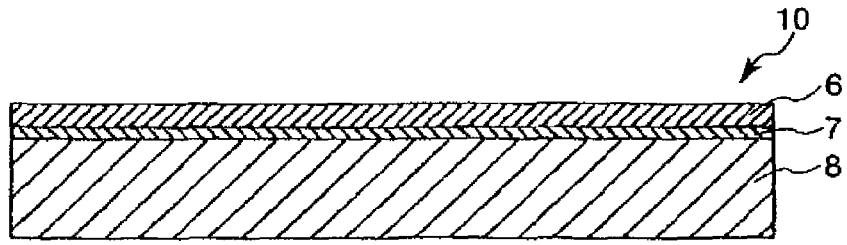
FIG. 3A to FIG. 3E are views illustrating a method for manufacturing the actuator shown in FIG. 1.

Referring first to FIG. 3A, a three-layer substrate 10 is prepared that has a first layer 6, a second layer 7 and a third layer 8 deposited one atop above in the named sequence. In this regard, the first layer 6 is to be etched at the etching step [2] set forth below, the second layer 7 is to be etched at the etching step [4] described below but substantially not etched at the following etching steps [2] and [3], and the third layer 8 is to be etched at the following etching step [3].

Among the respective layers constituting the substrate 10, the first layer 6, the second layer 7 and the third layer 8 become the structural body 2, the spacer 5 and the supporting substrate 4, respectively.

Although a variety of substrates comprising the layers 6, 7 and 8 in different combinations may be employed as the above-noted substrate 10, it is particularly preferred to use a SOI substrate that has the first layer 6 mainly composed of Si, the second layer 7 mainly composed of $SiO_2$ and the third layer 8 mainly composed of Si, each of which is deposited one atop above in the named order. Use of the SOI substrate as the substrate 10 makes it possible to manufacture the actuator 1 in a relatively simple manner. The following description will proceed by taking an instance where the SOI substrate is used as the substrate 10.

[2] First Etching Step (Second Step)

Figure 3B:
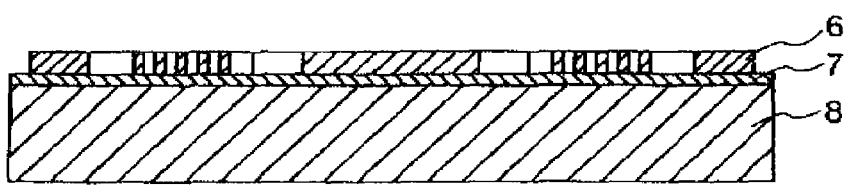

Referring next to FIG. 3B, the substrate 10 thus prepared is formed with a pattern of the structural body 2, i.e., patterns of the mass portion 21, the first supporting portions 22 and 23, the elastic connecting portions 24 and 25, the second supporting portions 31 and 32, the fixed portions 33 and 34, and the bridge portions 35 and 36.

Specifically, a mask whose shape corresponds to the pattern of the structural body 2 is first formed on an etching region of the first layer 6 (the opposite side from the second layer 7) of the substrate 10 by means of, e.g., a photolithography method, or other like methods.

Then, the first layer 6 is etched using the mask thus formed. This causes the first layer 6 to be patterned into a shape corresponding to the mask, i.e., a shape of the structural body 2. At this time, the second layer 7 is substantially not etched by the first etching operation and plays a role of a stopper layer that impedes any further propagation of the etching during the first etching step.

In the first etching process, for example, one kind or two or more kinds of dry etching methods such as a reactive ion etching method, a plasma etching method, a beam etching method and a photo-assisted etching method, wet etching methods and the like may be utilized independently or in combination. Among these methods, it is preferable to use the dry etching methods, particularly, the reactive ion etching method.

Use of the dry etching methods (particularly, the reactive ion etching method) at the first etching step makes it possible to etch the first layer 6 with enhanced anisotropy and further to conduct the patterning task for the first layer 6 with a higher degree of dimensional precision.

The mask is then removed. Removal of the mask prior to the third etching of the step [4] described later prevents or suppresses any contamination of an etching solution that would otherwise occur due to the dissolution of a mask material (e.g., a resist material or a metallic material) if the wet etching methods are used at the step [4].

The mask can be removed, for example, by a resist peeling solution in the case that the mask is composed of a resist material and by a metal peeling solution, such as a phosphoric acid solution, in the case that the mask is composed of a metallic material.

The step [3] described below may be carried out with no removal of the mask, in which case the mask is removed after the step [3] or [4].

As described above, the first layer 6 is patterned or processed at the step [2] into a shape corresponding to the structural body 2.

[3] Second Etching Step

Figure 3C:
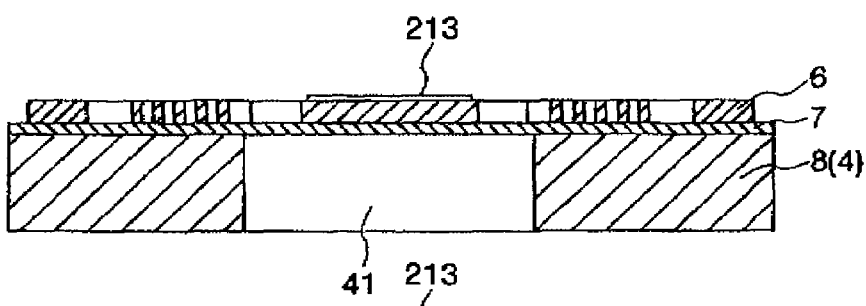

Turning to FIG. 3C, an opening 41 is formed through the third layer 8 of the substrate 10 which has undergone the above steps.

Specifically, a mask with an aperture corresponding to the opening 41 is first formed on an etching region of the third layer 8 of the substrate 10 by means of, e.g., a photolithography method, or other like methods.

Then, the third layer 8 is etched using the mask thus formed. This causes the third layer 8 to be patterned into a shape corresponding to the mask, i.e., a shape of the supporting substrate 4. At this time, the second layer 7 is substantially not etched by the second etching operation and plays a role of a stopper layer that impedes any further propagation of the etching at the second etching step.

The second etching step can be performed using the same method as in the first etching step. For example, one kind or two or more kinds of dry etching methods such as a reactive ion etching method, a plasma etching method, a beam etching method and a photo-assisted etching method, wet etching methods and the like may be utilized independently or in combination. Among these methods, it is preferable to use the dry etching methods, particularly, the reactive ion etching method.

Use of the dry etching methods (particularly, the reactive ion etching method) at the second etching step makes it possible to etch the third layer 8 with enhanced anisotropy and further to conduct the patterning task for the third layer 8 with a higher degree of dimensional precision.

The mask is then removed. Removal of the mask prior to the third etching of the step [4] described later prevents or suppresses any contamination of an etching solution that would otherwise occur due to the dissolution of a mask material (e.g., a resist material or a metallic material) if the wet etching methods are used at the step [4].

The mask can be removed, for example, by a resist peeling solution in the case that the mask is composed of a resist material and by a metal peeling solution, such as a phosphoric acid solution, in the case that the mask is composed of a metallic material.

The step [4] described below may be carried out with no removal of the mask, in which case the mask is removed after the step [4].

As described above, the third layer 8 is patterned or processed at the step [3] to thereby form the opening 41.

[3] Third Etching Step (Third Step)

Next, a third etching step is conducted with respect to the second layer 7, in which process the second layer 7 alone is etched while the first layer 6 and the third layer 8 remain substantially not etched. This removes a part of the second layer 7.

In the third etching step, for example, one kind or two or more kinds of dry etching methods such as a reactive ion etching method, a plasma etching method, a beam etching method and a photo-assisted etching method, wet etching methods and the like may be utilized independently or in combination. Among these methods, it is preferable to use the wet etching methods.

Use of the wet etching methods at the third etching step makes it possible to isotropically etch the second layer 7. Therefore, it is possible to efficiently remove the second layer 7 lying just below the first layer 6 that has survived the processing at the step [2] described above.

Examples of the etching solution used in the wet etching methods include hydrofluoric acid.

If the substrate 10 is dipped into such an etching solution, the part of the second layer 7 not covered with the survived first layer 6 (the structural body 2) begins to be etched from the upper surface thereof, which etching process proceeds isotropically. Furthermore, the part of the second layer 7 (the part corresponding to the opening 41) not covered with the survived third layer 8 begins to be etched from the lower surface thereof, which etching process proceeds isotropically.

As the etching continues to be done, the parts of the second layer 7 covered with the first layer 6 and the third layer 8 are also etched starting from the exposed side surfaces thereof and are removed gradually. As the second layer 7 is removed in this manner, a gap is created between the third layer 8 and the first layer 6.

In this connection, the first supporting portions 22 and 23 and the second supporting portions 31 and 32 have a greater area than that of the part of the structural body 2 excluding the first supporting portions 22 and 23 and the second supporting portions 31 and 32, when viewed from the top thereof. Accordingly, parts of the second layer 7 lying just below the first supporting portions 22 and 23 and the second supporting portions 31 and 32 still survive, at the time when parts of the second layer 7 disposed just below the part of the structural body 2 excluding the first supporting portions 22 and 23 and the second supporting portions 31 and 32 has been removed substantially in its entirety.

At this time, the parts of the second layer 7 corresponding to the fixed portions 33 and 34 have slits formed through the thickness direction thereof and, therefore, can be substantially entirely removed by the etching started from the side surfaces.

Figure 3D:
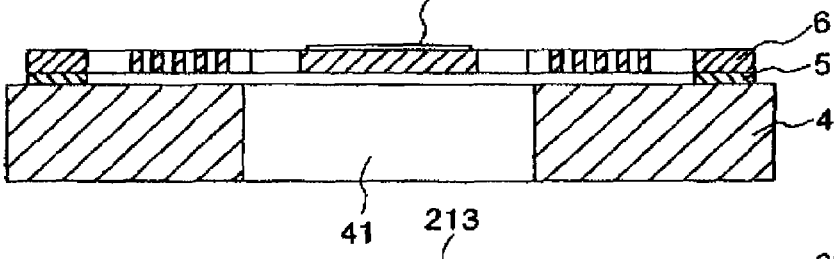

If the third etching process is terminated at this time (in this condition), the first supporting portions 22 and 23 and the second supporting portions 31 and 32 are respectively secured to the third layer 8 (the supporting substrate 4) by means of the survived second layer 7. On the other hand, the part of the structural body 2 excluding the first supporting portions 22 and 23 and the second supporting portions 31 and 32 remains floated from the third layer 8, as can be seen in FIG. 3D.

[5] Affixing Step (Fourth Step)

Figure 3E:
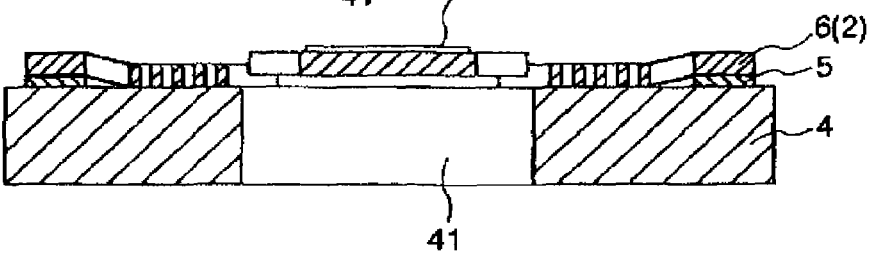

Referring next to FIG. 3E, the parts of the first layer 6 corresponding to the fixed portions 33 and 34 are affixed to the third layer 8 (i.e., the supporting substrate 4).

No particular restriction is imposed on the kinds of affixing methods, as far as the methods can affix the parts of the first layer 6 corresponding to the fixed portions 33 and 34 directly to the third layer 8 (i.e., the supporting substrate 4). However, it is preferred that the affixing step should be performed by cleansing the substrate 10 with cleansing fluid after patterning operation of the step [4], drying the substrate 10 thus cleansed, and then bringing the parts of the first layer 6 corresponding to the fixed portions 33 and 34 into contact with the third layer 8 through the use of an attractive force developed when the cleansing fluid is dislodged from between the first layer 6 and the second layer 7. In other words, it is desirable that the step of cleansing the substrate 10 should be performed prior to the affixing step (fourth step) and further that, in the affixing step (fourth step), the parts of the first layer 6 corresponding to the fixed portions 33 and 34 should be contacted with and affixed to the third layer 8 by drying and removing the cleansing fluid present between the parts of the first layer 6 corresponding to the fixed portions 33 and 34 and the third layer 8. This makes it possible to affix the fixed portions 33 and 34 to the supporting substrate 4 in a simplified manner during the process of manufacturing the actuator 1.

By way of the foregoing steps, the low voltage driven actuator 1 of a single-degree-of freedom vibrating system can be manufactured with ease.

Particularly, due to the fact that the fixed comb electrodes 331 and 341 and the movable comb electrodes 211 and 212 can be concurrently patterned on one and the same layer with the use of the same mask in the process of manufacturing the actuator 1, it becomes possible not only to quite accurately form the gaps between the fixed comb electrodes 331 and 341 and the movable comb electrodes 211 and 212, but also to simplify the process of manufacturing the actuator 1. This helps to reduce the size of the gaps, thus making the actuator 1 operable at a lower drive voltage. Additionally, the above-described initial deflection can be effected merely by affixing the fixed portions 33 and 34 to the supporting substrate 4 after the fixed comb electrodes 331 and 341 and the movable comb electrodes 211 and 212 have been subjected to the patterning process. This also helps to simplify the process of manufacturing the actuator 1.

Second Embodiment

Figure 4:
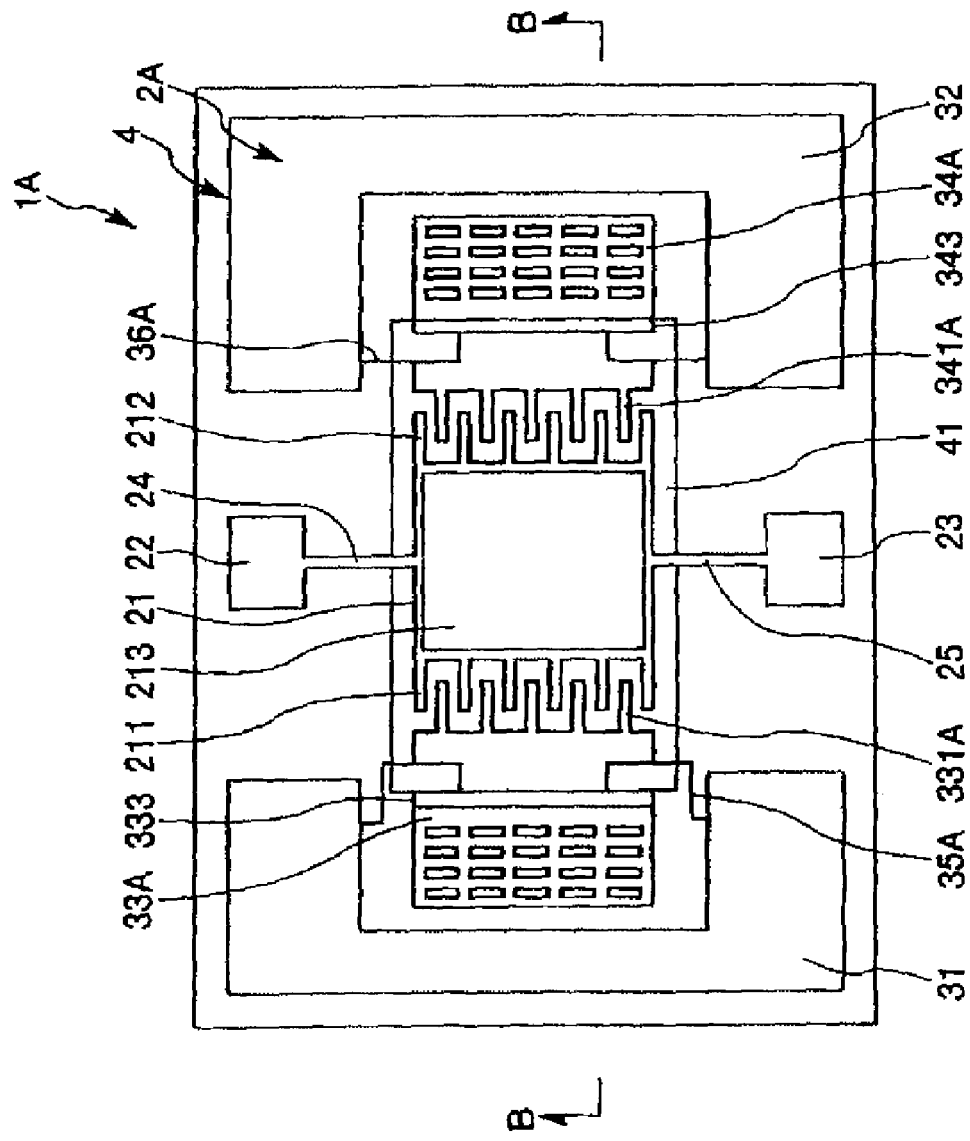
FIG. 4 is a plan view which shows a second embodiment of the actuator according to the present invention.
Figure 5:
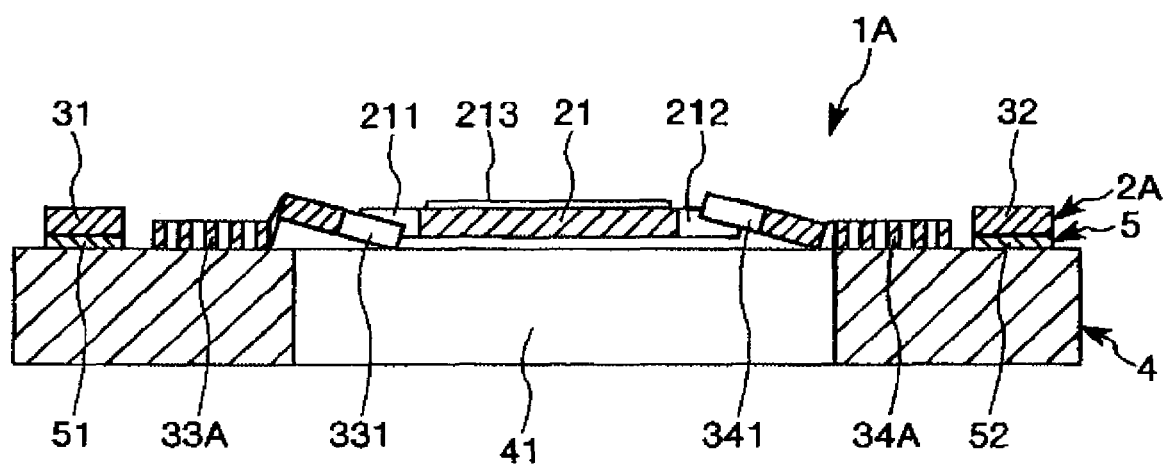
FIG. 5 is a cross-sectional view of the actuator taken along line B-B in FIG. 4.

Next, a second embodiment of the actuator according to the invention will be described. FIG. 4 is a plan view which shows a second embodiment of the actuator according to the invention. FIG. 5 is a cross-sectional view of the actuator taken along line B-B in FIG. 4. For the purpose of convenience in description, it should be noted that the front, the back, the right side and the left side, as viewed with respect to the paper plane in FIG. 4, will be respectively referred to as "upper", "lower", "right" and "left", or their equivalents, in the following description. Furthermore, the top, the bottom, the right side and the left side, as viewed with respect to the paper plane in FIG. 5, will be respectively referred to as "upper", "lower", "right" and "left", or their equivalents.

Hereinafter, an actuator according to the second embodiment will be described by placing a focus on the difference between the first and second embodiments, and no description will be given to the same parts or elements.

The actuator 1A of the second embodiment is substantially the same as the actuator 1 of the first embodiment, except for the configuration of the fixed portions, the fixed comb electrodes and the bridge portions.

More specifically, the actuator 1A shown in FIGS. 4 and 5 includes a structural body 2A of a single-degree-of-freedom vibrating system. The structural body 2A is supported on a supporting substrate 4 through a spacer 5.

The structural body 2A includes fixed portions 33A and 34A, fixed comb electrodes 331A and 341A, and bridge portions 35A and 36A. The fixed comb electrodes 331A and 341A are connected to the fixed portions 33A and 34A through linking members 333 and 343 in such a fashion that they can mesh with the movable comb electrodes 211 and 212 in a spaced-apart relationship. Each of the linking members 333 and 343 is comprised of a pair of L-shaped members.

On the other hand, the bridge portion 35A serves to indirectly connect the fixed portion 33A to the second supporting portion 31 through the fixed comb electrode 331A. To be more specific, the bridge portion 35A is comprised of a pair of crank-shaped members, one end of which is joined to the fixed comb electrode 331A and the other end of which is joined to the second supporting portion 31 at the same side as the fixed portion 33A with respect to the linking member 333. Accordingly, by affixing the fixed portion 33A to the supporting substrate 4, the fixed comb electrode 331A is rotated about a rotational axis, namely, about the coupling point of the bridge portion 35A to the fixed comb electrode 331A (the one end of the bridge portion 35A), and is inclined with respect to the major surface of the supporting substrate 4 in such a direction that the fixed comb electrode 331A can be initially deflected toward the supporting substrate 4.

Further, the bridge portion 36A serves to indirectly connect the fixed portion 34A to the second supporting portion 32 through the fixed comb electrode 341A. To be more specific, the bridge portion 36A is comprised of a pair of rectilinear members, one end of which is joined to the fixed comb electrode 341A and the other end of which is joined to the second supporting portion 32 at the opposite side from the fixed portion 34A with respect to the linking member 343. Accordingly, by affixing the fixed portion 34A to the supporting substrate 4, the fixed comb electrode 341A is rotated about a rotational axis, namely, about the coupling point of the bridge portion 36A to the fixed comb electrode 341A (the one end of the bridge portion 36A), and is inclined with respect to the major surface of the supporting substrate 4 in such a direction that the fixed comb electrode 341A can be initially deflected away from the supporting substrate 4.

By initially deflecting the fixed comb electrodes 331A and 341A so as to be oppositely inclined with respect to the supporting substrate 4, it is possible to make sure that the actuator 1A starts its operation smoothly and continues to be driven in a trouble-free fashion.

Particularly, in the present embodiment, the initial deflection noted above is effected by rotating the fixed comb electrode 331A about a rotational axis, namely, about the coupling point of the bridge portion 35A to the fixed comb electrode 331A (the one end of the bridge portion 35A), and also by rotating the fixed comb electrode 341A about a rotational axis, namely, about the coupling point of the bridge portion 36A to the fixed comb electrode 341A (the one end of the bridge portion 36A). This makes it possible to incline the fixed comb electrodes 331A and 341A with respect to the major surface of the supporting substrate 4 in a relatively simple manner.

Moreover, the fixed comb electrode 331A is initially deflected toward the supporting substrate 4 with respect to the second supporting portion 31, while the fixed comb electrode 341A is initially deflected away from the supporting substrate 4 with respect to the second supporting portion 32. This ensures that the actuator 1A starts its operation much more smoothly and continues to be driven in a still more trouble-free fashion.

Third Embodiment

Figure 6:
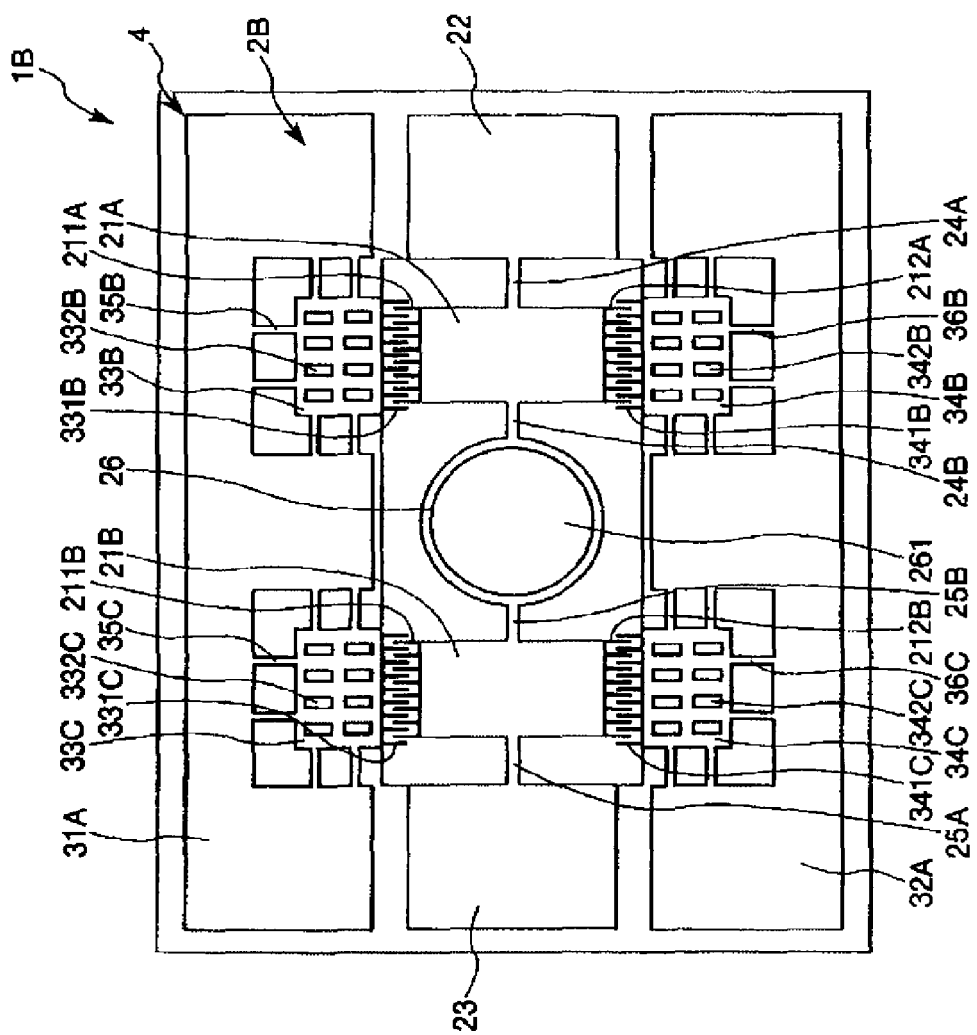
FIG. 6 is a plan view which shows a third embodiment of the actuator according to the present invention.

Next, a third embodiment of the actuator according to the invention will be described. FIG. 6 is a plan view which shows a third embodiment of the actuator according to the invention. For the purpose of convenience in description, it should be noted that the front, the back, the right side and the left side, as viewed with respect to the paper plane in FIG. 6, will be respectively referred to as "upper", "lower", "right" and "left", or their equivalents, in the following description.

Hereinafter, an actuator according to the third embodiment will be described by placing a focus on the difference between the first and third embodiments, and no description will be given to the same parts or elements.

The actuator 1B of the third embodiment is substantially the same as the actuator 1 of the first embodiment, except that it employs a two-degree-of-freedom vibrating system.

Namely, the actuator 1B shown in FIG. 6 includes a first vibrating system fabricated from the combination of two of the actuator 1 of the first embodiment and a second vibrating system adapted to vibrate in response to the vibration of the first vibrating system.

More specifically, the actuator 1B shown in FIG. 6 includes a structural body 2B having a two-degree-of-freedom vibrating system. The structural body 2B is supported on a supporting substrate 4 through a spacer (not shown). The structural body 2B is provided with first mass portions 21A and 21B, a second mass portion 26, first supporting portions 22 and 23, first elastic connecting portions 24A and 25A for interconnecting the first mass portions 21A and 21B and the first supporting portions 22 and 23, second elastic connecting portions 24B and 25B for interconnecting the second mass portion 26 and the first mass portions 21A and 21B, second supporting portions 31A and 32A, fixed portions 33B, 33C, 34B and 34C, and bridge portions 35B, 35C, 36B and 36C for joining the fixed portions 33B, 33C, 34B and 34C to the second supporting portions 31A and 32A.

Just like the structural body 2A described above, the structural body 2B is obtained by, for example, patterning a single silicon layer. Positioned substantially at the center of the structural body 2B is the second mass portion 26, at one end side (right side) of which is provided the first mass portion 21A and at the other end side (left side) of which is provided the first mass portion 21B.

Each of the first mass portions 21A and 21B and second mass portion 26 is of a generally plate shape. Further, in the present embodiment, the first mass portions 21A and 21B have substantially the same shape and size and are provided in a generally symmetrical relationship with each other, with the second mass portion 26 being placed therebetween. In addition, as viewed in FIG. 6, the first supporting portion 22 is disposed at the right side of the first mass portion 21A, whereas the first supporting portion 23 is disposed at the left side of the first mass portion 21B.

The second mass portion 26 is provided with a light reflecting portion 261 on its top surface (the opposite surface from the supporting substrate 4). This allows the actuator 1B of the present invention to find its application in optical devices such as an optical scanner, an optical attenuator, an optical switch and the like.

Further, as shown in FIG. 6, the structural body 2B is provided with a pair of first elastic connecting portions 24A and 25A for interconnecting the first mass portions 21A and 21B and the first supporting portions 22 and 23 in such a manner that the first mass portions 21A and 21B can be rotated with respect to the corresponding one of the first supporting portions 22 and 23. The structural body 2B is also provided with a pair of second elastic connecting portions 24B and 25B for interconnecting the respective first mass portions 21A and 21B and the second mass portion 26 in such a manner that the second mass portion 26 can be rotated with respect to the first mass portions 21A and 21B.

Namely, the second mass portion 26 is connected to the first mass portions 21A and 21B respectively through the second elastic connecting portions 24B and 25B, whereas the first mass portions 21A and 21B are respectively connected to the first supporting portions 22 and 23 through the first elastic connecting portions 24A and 25A. Moreover, the first elastic connecting portions 24A and 25A are coaxially aligned with the second elastic connecting portions 24B and 25B so that they can serve as a rotational center shaft (an axis of rotation).

The first mass portion 21A is provided with a pair of movable comb electrodes 211A and 212A at its opposite sides with respect to the rotational center shaft noted just above. Similarly, the first mass portion 21B is provided with a pair of movable comb electrodes 211B and 212B at its opposite sides with respect to the rotational center shaft.

As is apparent from the above, the structural body 2B includes a first vibrating system comprised of the first mass portions 21A and 21B and the first elastic connecting portions 24A and 25A, and a second vibrating system comprised of the second mass portion 26 and the second elastic connecting portions 24B and 25B. In other words, the structural body 2B is a two-degree-of-freedom vibrating system composed of the first vibrating system and the second vibrating system.

In order to drive the two-degree-of-freedom vibrating system described above, fixed comb electrodes 331B and 341B are integrally formed with the fixed portions 33B and 34B in such a way that they mesh with the movable comb electrodes 211A and 212A of the first mass portion 21A in a spaced-apart relationship. Similarly, fixed comb electrodes 331C and 341C are integrally formed with the fixed portions 33C and 34C in such a way that they mesh with the movable comb electrodes 211B and 212B of the first mass portion 21B in a spaced-apart relationship.

Namely, a pair of fixed comb electrodes 331B and 341B are provided in correspondence with the movable comb electrodes 211A and 212A, while a pair of fixed comb electrodes 331C and 341C are provided in correspondence with the movable comb electrodes 211B and 212B.

Further, each of the fixed portions 33B, 33C, 34B and 34C is of a plate shape and is directly secured to the supporting substrate 4 with no intervention of the spacer 5. This ensures that, just like the fixed comb electrodes 331 and 341 described above, each of the fixed comb electrodes 331B, 331C, 341B and 341C is initially deflected toward the supporting substrate 4 by the amount corresponding to the thickness of the spacer 5.

In addition, each of the fixed portions 33B, 33C, 34B and 34C has a plurality of slits 332B, 332C, 342B and 342C formed through the thickness direction thereof. This makes it possible that, in the process of manufacturing the actuator 1B, the fixed portions 33B, 33C, 34B and 34C are affixed to the supporting substrate 4 with ease. It is to be appreciated that the slits of the fixed portions 33B, 33C, 34B and 34C are not restricted to the ones described above, but may have an arbitrary shape, position and number as far as they can give rise to the initial deflection set forth above and provide the aforementioned advantageous effects.

The fixed portions 33B and 33C are connected to the second supporting portion 31A through the bridge portions 35B and 35C, while the fixed portions 34B and 34C are connected to the second supporting portion 32A through the bridge portions 36B and 36C. In other words, the bridge portions 35B and 35C serve to directly connect the fixed portions 33B and 33C to the second supporting portion 31A, whereas the bridge portions 36B and 36C function to directly connect the fixed portions 34B and 34C to the second supporting portion 32A.

The second supporting portions 31A and 32A are fixedly secured to the supporting substrate 4 through a spacer (not shown). Accordingly, the fixed portions 33B and 33C are affixed to the supporting substrate 4 in the state that they are deflected toward the supporting substrate 4 with respect to the second supporting portion 31A while bending the bridge portions 35B and 35C. Further, the fixed portions 34B and 34C are affixed to the supporting substrate 4 in the state that they are deflected toward the supporting substrate 4 with respect to the second supporting portion 32A while bending the bridge portions 36B and 36C. This allows the fixed comb electrodes 331B, 331C, 341B and 341C to assume an initial position in such a way that they are deflected in the thickness direction of the supporting substrate 4, as described earlier.

Next, description will be given to a method of operating the actuator 1B according to the present embodiment.

Voltages (e.g., alternating voltages having a phase difference of 180°) are alternately applied to between the movable comb electrode 211A and the fixed comb electrode 331B and between the movable comb electrode 212A and the fixed comb electrode 341B. In synchronism with this, voltages (e.g., alternating voltages having a phase difference of 180°) are alternately applied to between the movable comb electrode 211B and the fixed comb electrode 331C and between the movable comb electrode 212B and the fixed comb electrode 341C. This creates an electrostatic force (Coulomb force) alternately between the movable comb electrode 211A and the fixed comb electrode 331B and between the movable comb electrode 212A and the fixed comb electrode 341B. Further, in synchronism with this, an electrostatic force (Coulomb force) is alternately created between the movable comb electrode 211B and the fixed comb electrode 331C and between the movable comb electrode 212B and the fixed comb electrode 341C.

The electrostatic force enables the first mass portions 21A and 21B to vibrate or rotate about a rotational center axis, i.e., about the first elastic connecting portions 24A and 25A, in such a manner that the first mass portions 21A and 21B are inclined with respect to the major surface of the supporting substrate 4 (the surface parallel to the paper plane in FIG. 6).

In concert with this, the second mass portion 26 is vibrated or rotated about a rotational center axis, i.e., about the second elastic connecting portions 24B and 25B, in such a manner that the second mass portion 26 is inclined with respect to the major surface of the supporting substrate 4 (the surface parallel to the paper plane in FIG. 6).

The actuator 1B described above is capable of providing the same advantageous effects as attainable in the actuator 1 of the first embodiment. In addition to this, the actuator 1B of the present embodiment is able to increase the amplitude of vibration of the second mass portion 26 while reducing that of the first mass portions 21A and 21B. Namely, it is possible for the actuator 1B to make greater the amplitude of vibration of the second mass portion 26 while reducing the drive voltage.

Fourth Embodiment

Figure 7:
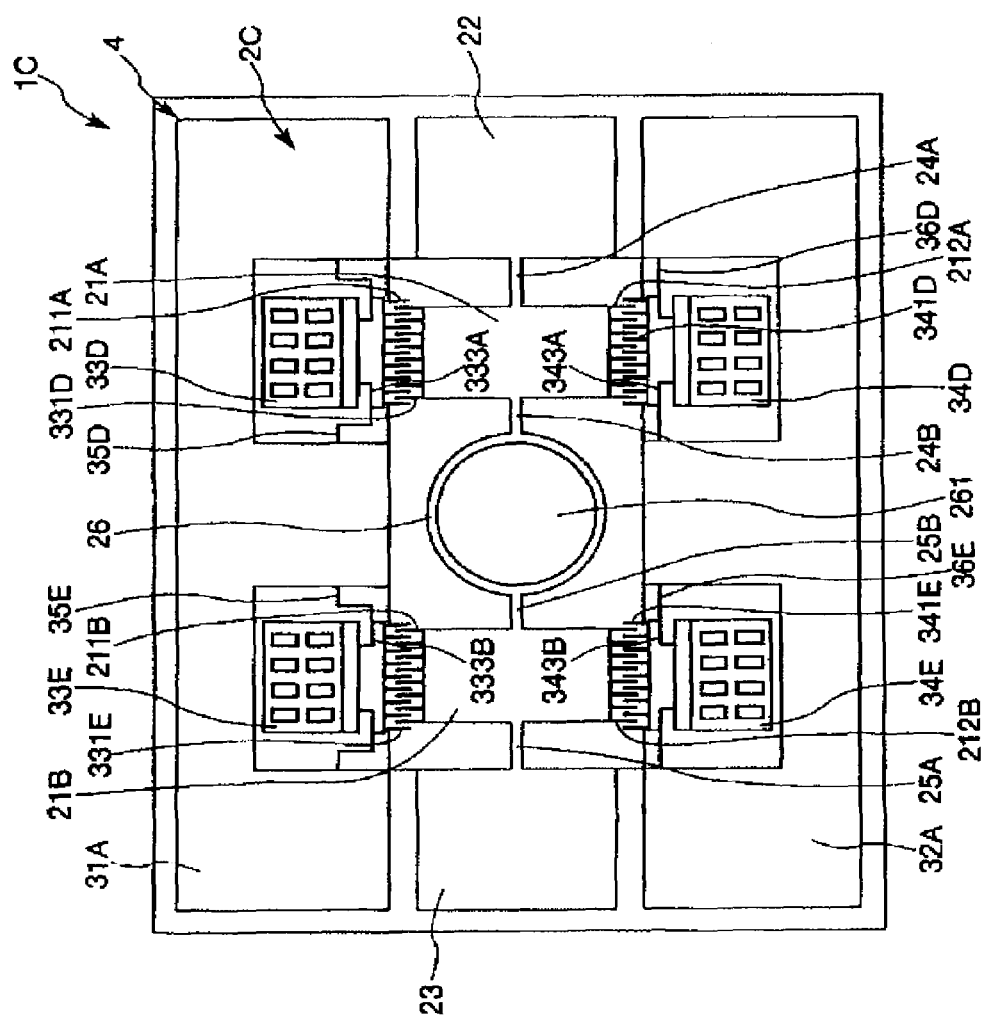
FIG. 7 is a plan view which shows a fourth embodiment of the actuator according to the present invention.

Next, a fourth embodiment of the actuator according to the invention will be described. FIG. 7 is a plan view which shows a fourth embodiment of the actuator according to the invention. For the purpose of convenience in description, it should be noted that the front, the back, the right side and the left side, as viewed with respect to the paper plane in FIG. 7, will be respectively referred to as "upper", "lower", "right" and "left", or their equivalents, in the following description.

Hereinafter, an actuator according to the fourth embodiment will be described by placing a focus on the difference between the third and fourth embodiments, and no description will be given to the same parts or elements.

The actuator 1C of the fourth embodiment is substantially the same as the actuator 1B of the third embodiment, except that it employs the same fixed portions, fixed comb electrodes and bridge portions as used in the actuator of the second embodiment described above.

Namely, the actuator 1C shown in FIG. 7 is constructed by combining the actuator of the second embodiment with the actuator of the third embodiment.

More specifically, the actuator 1C shown in FIG. 7 includes a structural body 2C having a two-degree-of-freedom vibrating system. The structural body 2C is supported on a supporting substrate 4 through a spacer 5.

The structural body 2C includes fixed portions 33D, 33E, 34D and 34E, fixed comb electrodes 331D, 331E, 341D and 341E, and bridge portions 35A and 36A. The fixed comb electrodes 331D and 341D are connected to the fixed portions 33D and 34D through linking members 333A and 343A in such a fashion that they can mesh with the movable comb electrodes 211A and 212A in a spaced-apart relationship, respectively. Further, the fixed comb electrodes 331E and 341E are connected to the fixed portions 33E and 34E through linking members 333B and 343B in such a fashion that they can mesh with the movable comb electrodes 211B and 212B in a spaced-apart relationship, respectively. Each of the linking members 333A, 333B, 343A and 343B is comprised of a pair of L-shaped members.

On the other hand, the bridge portions 35D and 35E serve to indirectly connect the fixed portions 33D and 33E to the second supporting portion 31A through the fixed comb electrodes 331D and 331E, respectively. To be more specific, each of the bridge portions 35D and 35E is comprised of a pair of crank-shaped members, one end of which is joined to each of the fixed comb electrodes 331D and 331E, and the other end of which is joined to the second supporting portion 31A at the same side as the fixed portion 33D and 33E with respect to the linking members 333A and 333B. Accordingly, by affixing the fixed portions 33D and 33E to the supporting substrate 4, the fixed comb electrodes 331D and 331E are rotated about a rotational axis, namely, about the coupling point of the bridge portions 35D and 35E to the fixed comb electrodes 331D and 331E (the one end of the bridge portions 35D and 35E), and are inclined with respect to the major surface of the supporting substrate 4 in such a direction that the fixed comb electrode 331D and 331E can be initially deflected toward the supporting substrate 4.

Further, the bridge portions 36D and 36E serve to indirectly connect the fixed portions 34D and 34E to the second supporting portion 32A through the fixed comb electrodes 341D and 341E. To be more specific, each of the bridge portion 36D and 36E is comprised of a pair of rectilinear members, one end of which is joined to each of the fixed comb electrodes 341D and 341E, and the other end of which is joined to the second supporting portion 32A at the opposite side from the fixed portions 34D and 34E with respect to the linking members 343A and 343B. Accordingly, by affixing the fixed portions 34D and 34E to the supporting substrate 4, the fixed comb electrodes 341D and 341E are rotated about a rotational axis, namely, about the coupling point of the bridge portions 36D and 36E to the fixed comb electrodes 341D and 341E (the one end of the bridge portions 36D and 36E), and are inclined with respect to the major surface of the supporting substrate 4 in such a direction that the fixed comb electrodes 341D and 341E can be initially deflected away from the supporting substrate 4.

By initially deflecting the fixed comb electrodes 331D, 331E, 341D and 341E so as to be oppositely inclined with respect to the supporting substrate 4, it is possible to make sure that the actuator 1C starts its operation smoothly and continues to be driven in a trouble-free fashion.

Particularly, in the present embodiment, the initial deflection described above is effected by rotating the fixed comb electrode 331D about a rotational axis, namely, about the coupling point of the bridge portion 35D to the fixed comb electrode 331D (the one end of the bridge portion 35D), and also by rotating the fixed comb electrode 341D about a rotational axis, namely, about the coupling point of the bridge portion 36D to the fixed comb electrode 341D (the one end of the bridge portion 36D). In a similar manner, the initial deflection described above is effected by rotating the fixed comb electrode 331E about a rotational axis, namely, about the coupling point of the bridge portion 35E to the fixed comb electrode 331E (the one end of the bridge portion 35E), and also by rotating the fixed comb electrode 341E about a rotational axis, namely, about the coupling point of the bridge portion 36E to the fixed comb electrode 341E (the one end of the bridge portion 36E). This makes it possible to incline the fixed comb electrodes 331D, 331E, 341D and 341E with respect to the major surface of the supporting substrate 4 in a relatively simple manner.

Moreover, the fixed comb electrode 341D is initially deflected toward the supporting substrate 4 with respect to the second supporting portion 32A, while the fixed comb electrode 331D is initially deflected away from the supporting substrate 4 with respect to the second supporting portion 31A. Likewise, the fixed comb electrode 341E is initially deflected toward the supporting substrate 4 with respect to the second supporting portion 32A, while the fixed comb electrode 331E is initially deflected away from the supporting substrate 4 with respect to the second supporting portion 31A. This ensures that the actuator 1C starts its operation much more smoothly and continues to be driven in a still more trouble-free fashion.

The actuators 1, 1A, 1B and 1C described above can find their applications in a variety of electronic equipments, thus making the electronic equipments highly reliable.

For example, the above-described actuators 1, 1A, 1B and 1C can be preferably applied to optical scanners for use in laser printers, bar-code readers, laser-scanning confocal microscopes and the like, or displays for imaging.

Although the actuator according to the present invention has been descried with reference to a number of embodiments shown in the drawings, it should be appreciated that the invention is not limited to the particular embodiments. For example, so long as the same or similar functions are achieved, it is possible to make various changes and additions to the respective parts of the actuator of the invention.

Further, even though the actuator of the invention has been described in the first through fourth embodiments to have a structure of a shape generally symmetrical with respect to a plane passing the rotational axis of the mass portion (or the first and second mass portions) and lying orthogonal to the major surface of the supporting substrate, an asymmetrical structure may be employed in the present invention. In addition, although the actuator of the invention has been described to have a structure of a shape generally symmetrical with respect to a plane passing the center of the actuator and lying orthogonal to the rotational axis of the mass portion (or the first and second mass portions), the actuator may have an asymmetrical structure.

Further, although the actuator of the invention has been described in the first and second embodiments to have a single pair of elastic connecting portions, the invention is not limited thereto but may have two or more pairs of elastic connecting portions. Although the actuator of the invention has been described in the third and fourth embodiments to have a single pair of first elastic connecting portions, the invention is not limited thereto but may have two or more pairs of first elastic connecting portions. Although the actuator of the invention has been described in the third and fourth embodiments to have a single pair of second elastic connecting portions, the invention is not limited thereto but may have two or more pairs of second elastic connecting portions.

Still further, although the light reflecting portion is provided on the top surface (the opposite surface from the supporting substrate) of the mass portion or the second mass portion in the foregoing description, it may be provided on the bottom surface or both of the top and bottom surfaces.

Yet still further, although the elastic connecting portions, the first elastic connecting portions and the second elastic connecting portions have been described in the foregoing embodiments to have shapes shown in the drawings, the shapes of the elastic connecting portions are not limited thereto but may be a crank shape or a branched shape, for example.

What is claimed is:

1. An actuator comprising:
   a supporting substrate having an opening;
   a spacer provided on the supporting substrate;
   a pair of supporting portions each secured to the supporting substrate through the spacer;
   a mass portion being arranged between the pair of supporting portions, through elastic connecting portions above the opening of the supporting substrate in such a manner that the mass portion can be rotated with respect to the supporting portions about the elastic connecting portions serving as a rotational axis;
   a first movable comb electrode and a second movable comb electrode provided in pair at the opposite sides of the mass portion symmetrically with the rotational axis of the mass portion;
   a first fixed portion and a second fixed portion respectively provided outside the opening of the support substrate symmetrically with the rotational axis of the mass portion and directly affixed to the supporting substrate with no intervention of the spacer so that the first fixed portion and the second fixed portion are in parallel with the mass portion in the thickness direction thereof but at a lower position than a position of the mass portion; and
   a first fixed comb electrode integrally formed with or connected to the first fixed portion and meshing with the first movable comb electrode in a spaced-apart relationship and a second fixed comb electrode integrally formed with or connected to the second fixed portion and meshing with the second movable comb electrode in a spaced-apart relationship;
   wherein a part of each of the first fixed comb electrode and the second fixed comb electrode overlaps with a part of the corresponding movable comb electrode in a state where no alternating voltage is applied therebetween in a thickness direction of each of the first fixed comb electrode and the second fixed comb electrode when viewed from the rotational axis of the mass portion,
   wherein the first fixed comb electrode is initially deflected so as to be inclined toward the supporting substrate with respect to the supporting substrate, and the second fixed comb electrode is initially deflected so as to be inclined away from the supporting substrate with respect to the supporting substrate, and
   wherein the mass portion is rotated by applying alternating voltages across each of the first movable comb electrode and the second movable comb electrode and the corresponding fixed comb electrode.

* * * * *